(12) United States Patent
Yen et al.

(10) Patent No.: US 11,611,428 B2
(45) Date of Patent: *Mar. 21, 2023

(54) CLOCK DATA RECOVERY

(71) Applicant: TEXAS INSTRUMENTS INCORPORATED, Dallas, TX (US)

(72) Inventors: Chen-Lun Yen, Santa Clara, CA (US); Ramsin Michael Ziazadeh, San Jose, CA (US); Xin Liu, Saratoga, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/385,159

(22) Filed: Jul. 26, 2021

(65) Prior Publication Data

US 2021/0351909 A1 Nov. 11, 2021

Related U.S. Application Data

(63) Continuation of application No. 17/000,498, filed on Aug. 24, 2020, now Pat. No. 11,108,538, which is a
(Continued)

(51) Int. Cl.
*H04L 7/033* (2006.01)
*H03L 7/099* (2006.01)
*H03L 7/18* (2006.01)
*H03L 7/08* (2006.01)
*H04L 7/00* (2006.01)
(Continued)

(52) U.S. Cl.
CPC ............ *H04L 7/0332* (2013.01); *H03L 7/085* (2013.01); *H03L 7/0807* (2013.01); *H03L 7/099* (2013.01); *H03L 7/18* (2013.01); *H04L 7/0087* (2013.01); *H03K 19/20* (2013.01)

(58) Field of Classification Search
CPC . H03D 3/24; H03D 13/00; H03L 7/00; H03L 7/06; H03L 7/18; H03L 7/085; H03L 7/087; H03L 7/095; H03L 7/099; H03L 7/0807; H04L 7/00; H04L 7/033; H04L 7/0087; H04L 7/0332; H04L 25/00
USPC .......... 327/7, 12, 147, 156; 331/2, 8, 10, 23, 331/25, 37; 375/260, 261, 371, 373, 376
See application file for complete search history.

(56) References Cited

U.S. PATENT DOCUMENTS 10,790,959 B1 * 9/2020 Yen .......................... H03L 7/085
11,108,538 B2 * 8/2021 Yen ........................ H04L 7/0332
(Continued)

*Primary Examiner* — Shawkat M Ali
(74) *Attorney, Agent, or Firm* — John R. Pessetto; Frank D. Cimino

(57) ABSTRACT

A circuit includes a voltage-controlled oscillator (VCO) and a frequency divider. The frequency divider input is coupled to the VCO output. The circuit further includes a phase-frequency detector (PFD). A control output of the PFD is coupled to the VCO. A first PFD input is coupled to a first frequency divider output, and a second PFD input is coupled to a second frequency divider output. The first frequency divider output is configured to provide a first frequency divider signal and the second frequency divider output is configured to provide a second frequency divider signal 90 degrees out of phase with respect to the first frequency divider signal. The PFD is configured to detect an occurrence of at least two edges of a signal on the data input while the second frequency divider signal is continuously logic high across the at least two edges.

4 Claims, 7 Drawing Sheets

Related U.S. Application Data continuation of application No. 16/694,186, filed on Nov. 25, 2019, now Pat. No. 10,790,959.

(51) Int. Cl.
  *H03L 7/085* (2006.01)
  *H03K 19/20* (2006.01)

(56) References Cited

U.S. PATENT DOCUMENTS

| | | |
|---|---|---|
| 2003/0112913 A1 | 6/2003 | Balasubramanian |
| 2009/0033381 A1 | 2/2009 | Lee et al. |
| 2010/0002822 A1 | 1/2010 | Arima et al. |
| 2010/0289593 A1 | 11/2010 | Chen et al. |
| 2012/0098570 A1 | 4/2012 | Wang et al. |

* cited by examiner

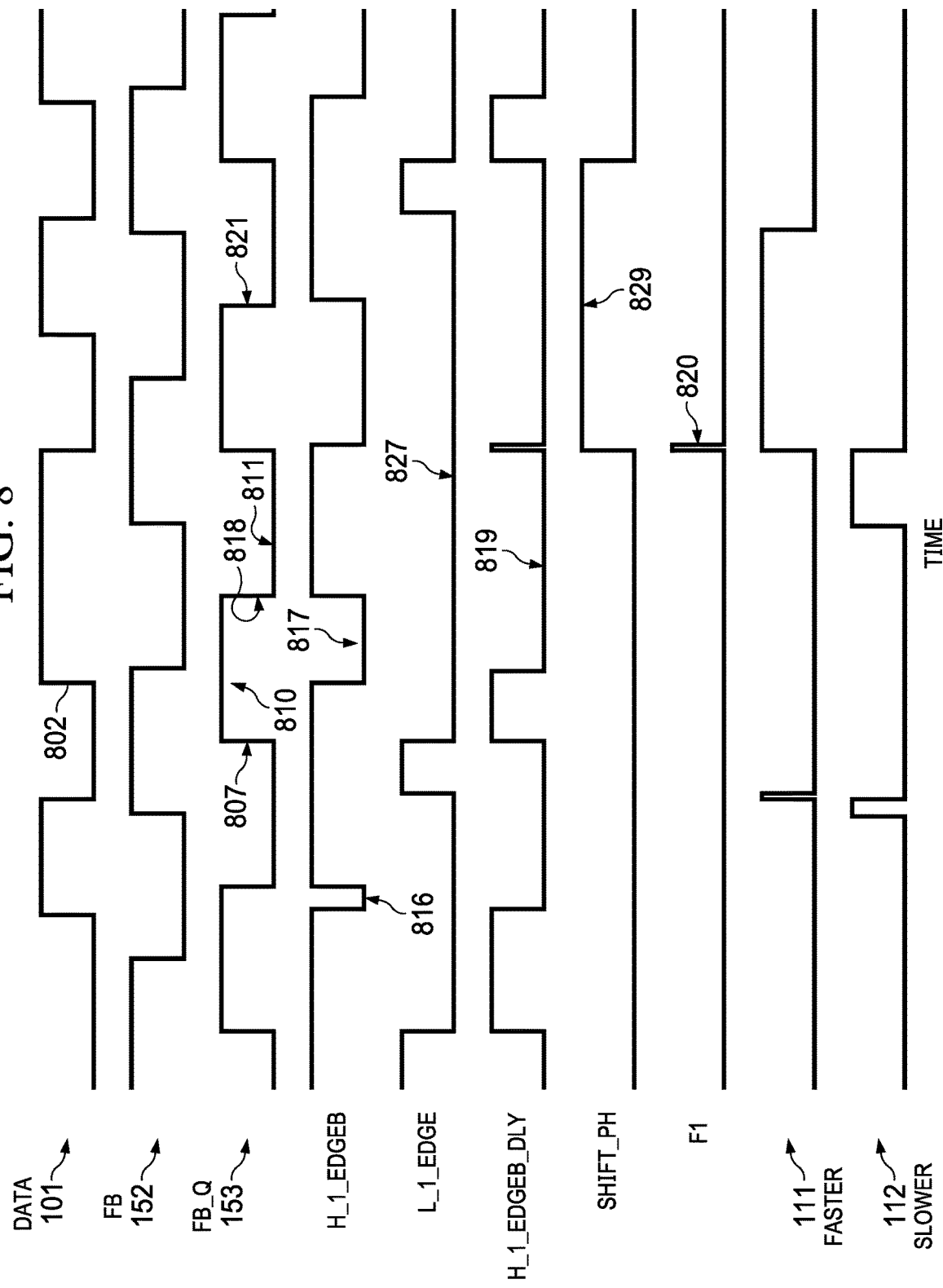

CLOCK DATA RECOVERY

CROSS REFERENCE TO RELATED APPLICATION(S)

This continuation application claims priority to U.S. patent application Ser. No. 17/000,498, filed Aug. 24, 2020, which claims priority to U.S. patent application Ser. No. 16/694,186, filed Nov. 25, 2019 (now U.S. Pat. No. 10,790,959), both of which are incorporated herein by reference in their entirety.

BACKGROUND

When data is transmitted from a transmitter to a receiver, the receiver uses a dock to latch in the received data. In some systems, the transmitter transmits a clock signal along with a data signal, and the receiver uses the received clock to latch the received data. In other systems, however, the transmitter does not transmit a clock signal, Instead, the data is encoded in such a way that the receiver can recover the clock from the data itself. Manchester encoding is an example of a self-clocking signal A receiver can recover the clock from Manchester-encoded data and then use the recovered clock to decode the received Manchester-encoded data.

SUMMARY

In accordance with at least one example, a circuit includes a voltage-controlled oscillator (VCO) and a frequency divider. The frequency divider input is coupled to the VCO output. The circuit further includes a phase-frequency detector (PFD). A control output of the PFD is coupled to the VCO. A first PFD input is coupled to a first frequency divider output, and a second PFD input is coupled to a second frequency divider output. The first frequency divider output is configured to provide a first frequency divider signal and the second frequency divider output is configured to provide a second frequency divider signal 90 degrees out of phase with respect to the first frequency divider signal. The PFD is configured to detect an occurrence of at least two edges of a signal on the data input while the second frequency divider signal is continuously logic high across the at least two edges.

BRIEF DESCRIPTION OF THE DRAWINGS

For a detailed description of various examples, reference will now be made to the accompanying drawings in which:

FIG. 8 is a timing diagram illustrating the operation of the phase-frequency detector of FIG. 5 to address the problem illustrated in FIG. 4.

DETAILED DESCRIPTION

Figure 1:
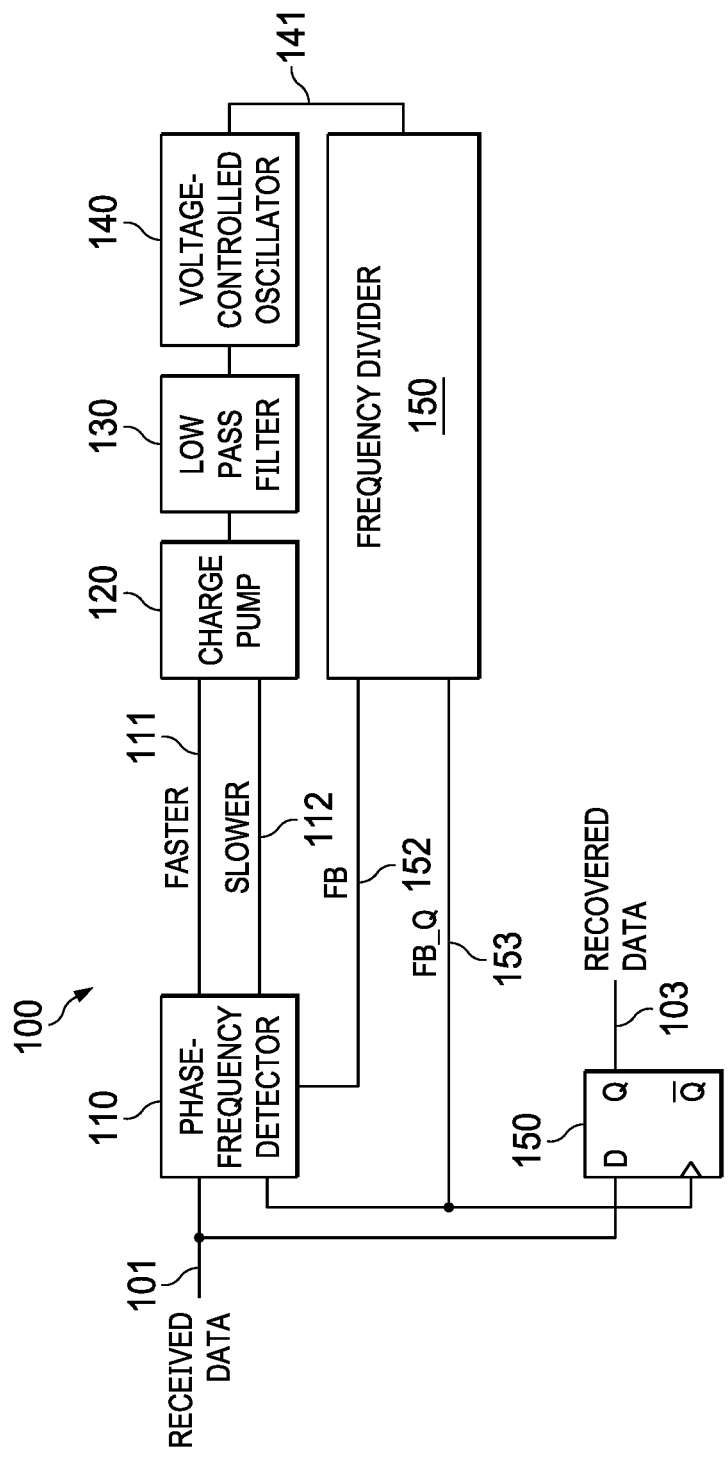
FIG. 1 illustrates an example of a clock data recovery (CDR) circuit of a receiver.

FIG. 1 shows an example implementation of a clock data recovery (CDR) circuit 100 of a receiver. The CDR circuit 100 receives input data 101, recovers a clock FB_Q from the received DATA 101, and uses the received clock FB_Q to decode the received DATA 101 to produce the recovered data 103. In this example, the received DATA 101 includes Manchester-encoded data, but other types of encoding schemes can be used as well. In general, the received data 101 is data from which a clock can be recovered. In the example, of FIG. 1, CDR circuit 100 includes a phase-frequency detector (PFD) 110, a charge pump (CP) 120, a low pass filter (LPF) 130, a voltage-controlled oscillator (VCO) 140, a frequency divider 150, and a data (D) flip-flop 150. The VCO 140 produces an output signal 141 whose frequency is divided down by frequency divider 150 to produce a feedback (FB) clock 152. The frequency divider 150 also generates the clock FB_Q 153, which is identical to FB 152 but phase-shifted by 90 degrees (and referred to as a "quadrature" clock). The PFD 110 generally determines whether the phase of FB 152 leads or lags that of the received DATA 101 and asserts either a FASTER signal 111 or a SLOWER signal 112 to the CP 120. Assertion of FASTER 111 causes the CP 120 to generate a signal that, after filtering by the LPF 130, causes the VCO 140 to increase the frequency of output signal 141. Conversely, assertion of SLOWER 112 causes the CP 120 to generate a signal that, after filtering by the LPF 130, causes the VCO 140 to decrease the frequency of output signal 141. The loop formed by the PFD 110, CP 120, LPF 130, VCO 140, and frequency divider 150 continuously attempts to adjust the frequency of FB 152 so that FB 152 maintains frequency and phase-lock to the received data 101.

Figure 2:
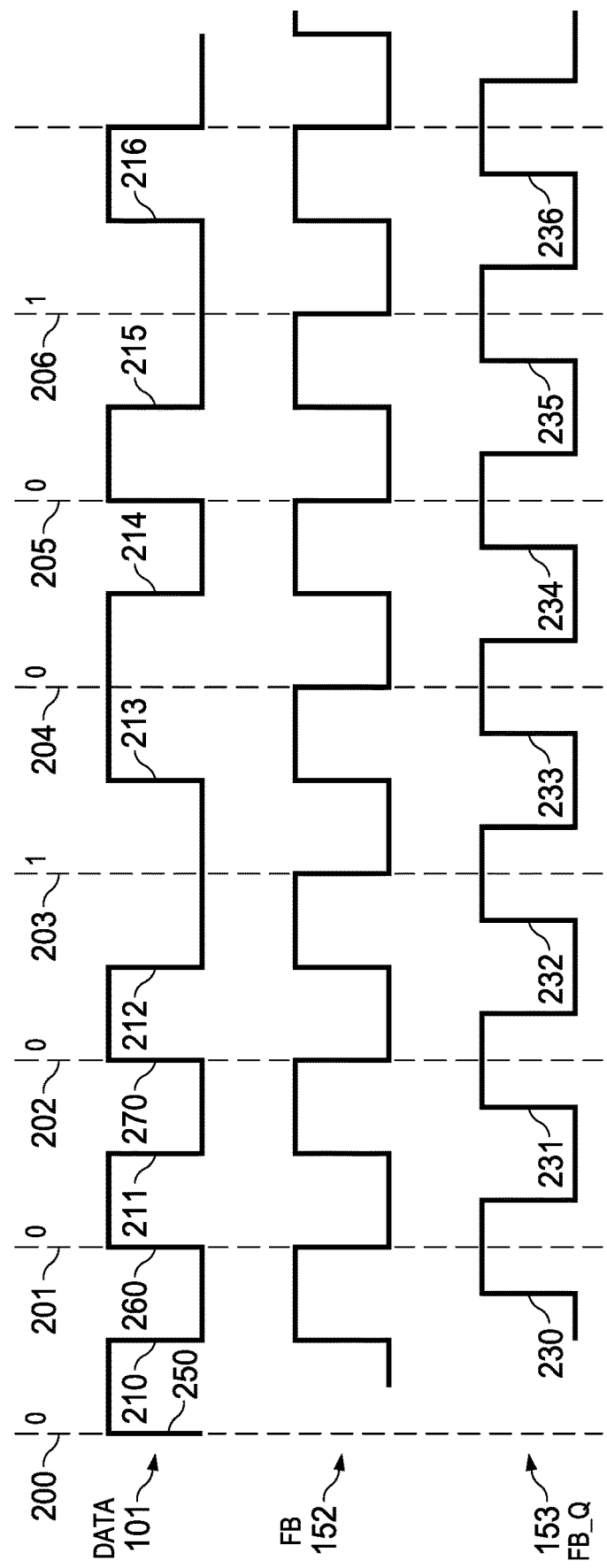
FIG. 2 is a timing diagram illustrating desired behavior of the CDR circuit.

FIG. 2 shows a timing diagram illustrating an example of received DATA 101 as well as FB 152 and FB_Q 153. In this example, DATA 101 comprises the bit sequence 0-0-0-1-0-0-1 as shown at 200-206. Each bit of data is Manchester-encoded in the transitions (edges) of the received DATA 101. A "0", for example, is encoded as a high-to-low transition (a falling edge), and a "1" is encoded as a low-to-high transition (a rising edge). As such, the first 0 data value 200 is encoded as a falling edge as shown at 210. The second 0 data value 201 is encoded as falling edge 211. The third data value 202 is encoded as falling edge 212. The fourth data value 203 is encoded as rising edge 213. The next two 0 data values 204 and 205 are encoded as respective falling edge 214 and 215. The last shown data value 206 is encoded as rising edge 216.

In the example of FIG. 2, FB 152 is shown properly phase and frequency locked to received DATA 101. Specifically, the rising edges of FB 152 are phase-locked to the falling edges of received data 101. As illustrated in FIG. 2, edges 210-216 of the received DATA 101 encode the logical state of the respective bit. A falling edge encodes a "0" and thus immediately after the falling edge, the received DATA 101 remains low at least until the next data bit. Similarly, a rising edge encodes a "1" and thus immediately after the rising edge, the received DATA 101 remains high at least until the next data bit. As such, the logic state of received DATA 101 after the edges 210-216 also indicates the value of the respective data bit. Each rising edge of FB_Q 153 occurs during those periods of time just after data edges 210-216 during which the logical state of DATA 101 represents the bit value. For example, rising edge 230 of FB_Q 153 occurs when DATA 101 is a 0. FIG. 1 illustrates that FB_Q 153 is provided to the clock input of D flip-flop 150. The D input of D flip-flop 150 receives the received data 101. As such, FB_Q is used to clock the D flip-flop 150 and thus the recovered data 103 from D flip-flop 150 is the logical state of the received data 101 (high or low) at an occurrence of each rising edge of FB_Q 153. Using FB_Q edge 230 the recovered data 103 latched by D flip-flop 150 will be a 0, which is the correct data value as shown at 200. Similarly, rising edges 231 and 232 occur while DATA 101 also is 0, and thus the next two recovered data bits are 0. Rising edge 233 occurs when data 101 is a 1, and thus the recovered data bit latched by D flip-flop 150 is a 1. In a similar fashion, rising edges 234, 235, and 236 cause D flip-flop 150 to latch a 0-0-1. The feedback loop shown in FIG. 1 thus phase and frequency locks FB 152 to the received DATA 101 and uses the quadrature clock FB_Q to clock D flip-flop 150 to produce the recovered data 103.

Several problems, however, may occur. In at least some clock data recovery systems, the rate (frequency) of the encoded data can vary from application to application and vary over a relatively wide range. A CDR-based receiver should be capable of correctly recovering the clock and thus the data without being pre-programmed for the incoming data rate. In some systems, the VCO 140 output clock frequency (and thus FB 152) is initialized to a frequency that is higher than any anticipated frequency of DATA 101. As the loop begins to achieve lock, the PFD 110 repeatedly asserts SLOWER 112 in an attempt to decrease the speed of the VCO output clock and thus the speed of FB 152. Eventually, the frequency of FB 152 will approximately match that of DATA 101. However, it is possible that the frequency of FB 152 may become lower than the frequency of DATA 101. When that happens, the recovered data will be incorrect. In some systems, the incorrectness of the data is detected by performing a data integrity check (e.g., parity). If the data is determined to be incorrect, the CDR may be reset with the FB 152 frequency again being initialized to a high value so that the loop can gradually lower its frequency to achieve proper lock. Unfortunately, the CDR may need to be reset numerous times to achieve proper lock.

Another potential problem is that correct frequency lock may be achieved (i.e., the frequency of FB 152 matches that of DATA 101), but FB 152 locks to the incorrect phase of DATA 101. For example, in FIG. 2 the rising edges of FB 152 might lock to the rising edges 250, 260, and 270 of DATA 101 instead of to falling edges 210, 211, and 212. Any recovered data will likely be incorrect, and the CDR will need to be reset so that it can again attempt to properly frequency and phase lock to Data 101. Repeatedly resetting the CDR undesirably takes time, consumes power, and slows down the operation of the system. The examples described herein solve both of these problems.

Figure 3:
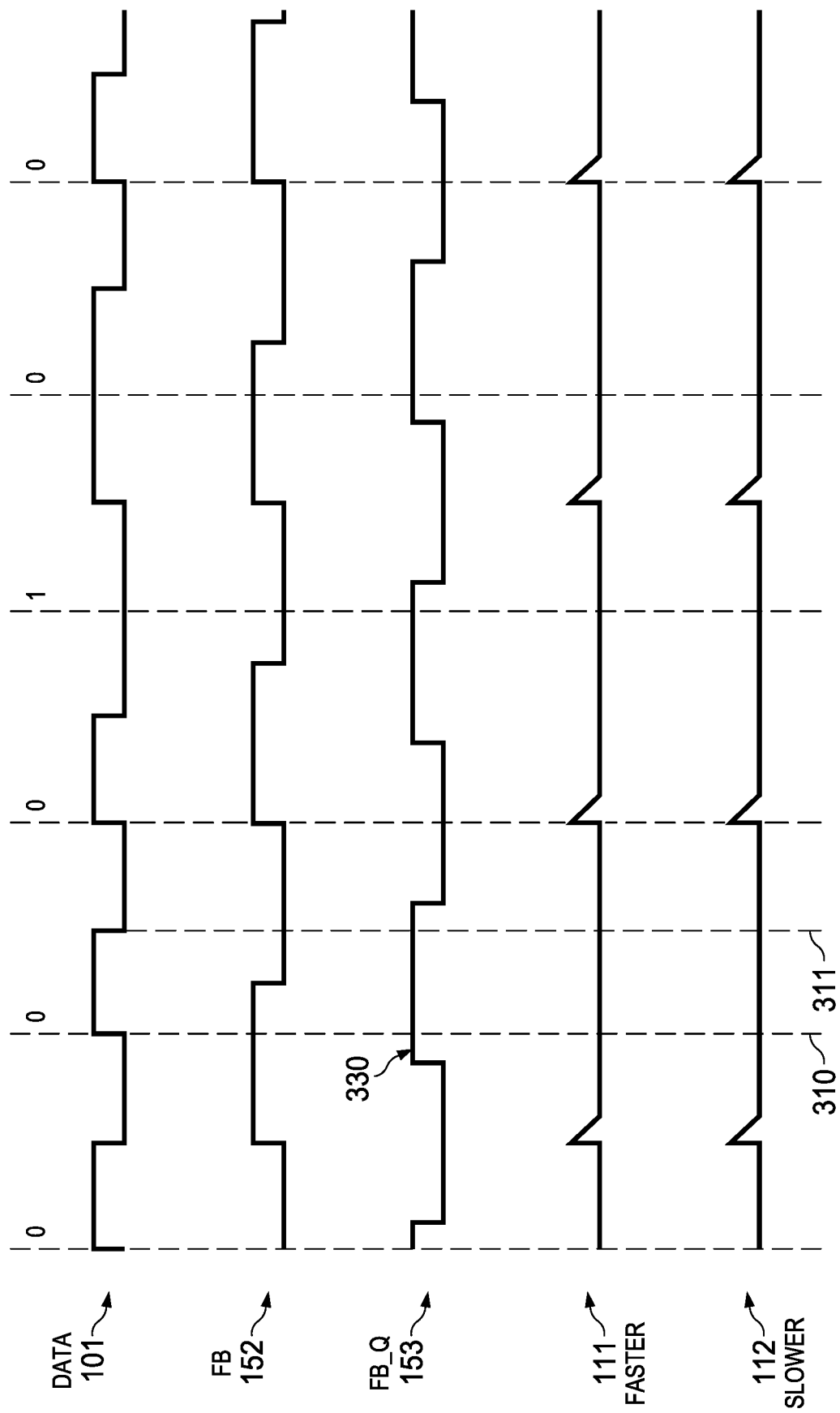
FIG. 3 is a timing diagram illustrating one potential problem with a CDR circuit.

FIG. 3 shows an example of the first problem described above in which the rate of FB 152 and FB_Q 153 is slower than the rate of DATA 101. In this example, the rising edges of FB 152 are phase locked to falling edges of DATA 101, but because the frequency of FB 152 is less than the data rate of DATA 101, some of the falling edges of DATA 101 (e.g., edge 311) do not coincide with a rising edge of FB 152. FIG. 3 is an example of a stable state of the CDR but the frequency of FB 152 and FB_Q 153 are too slow. In accordance with the disclosed implementation, this condition (FB's frequency being lower than DATA's frequency) can be detected by detecting the occurrence of two edges of DATA 101 while FB_Q is high. As shown in FIG. 3, edges 310 and 311 of DATA 101 occur while FB_Q is high at 330. That two edges (e.g., edges 310 and 311) occur while FB_Q is high (e.g., at 330) is indicative of FB_Q 153 (and thus FB 152) having a frequency that is lower than the frequency of DATA 101. The disclosed implementation exploits the detection of two edges of DATA 101 while FB_Q is high and causes an assertion of FASTER 111 (not shown in FIG. 3 but shown in FIG. 7). FASTER 111 being asserted high by PFD 110 causes the VCO to increase the frequency of its output signal and thus increase the frequency of FB 152. By way of definition, the time period during which FB_Q is high (330) is referred to as a "window."

Figure 4:
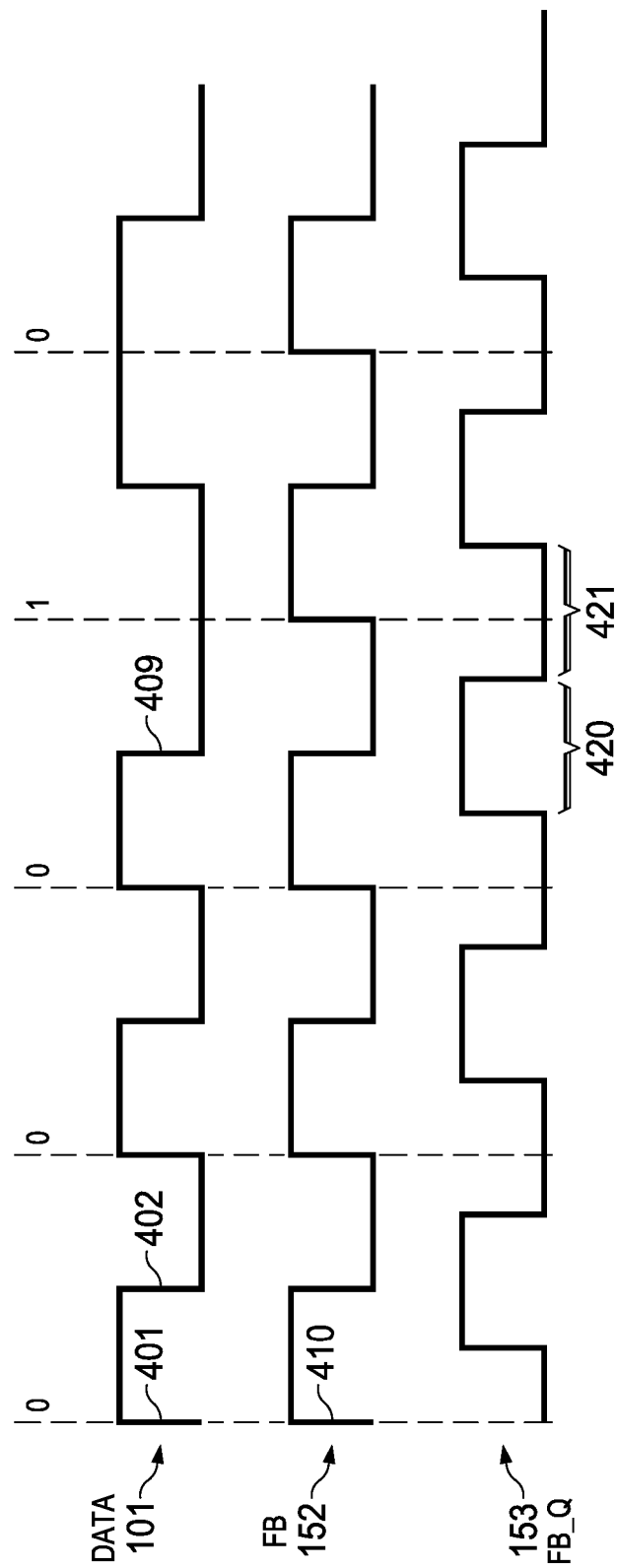
FIG. 4 is a timing diagram illustrating another potential problem with a CDR circuit.

FIG. 4 illustrates the second problem described above in which FB 152 is correctly frequency-locked to DATA 101 but is locked to the incorrect phase of Data 101. Instead of FB 152 edge 410 correctly being locked to falling edge 402 of DATA 101, FB edge 410 is incorrectly phase-locked to rising DATA edge 401. In accordance with the disclosed implementation, this condition can be detected by detecting the occurrence of one or more edges of DATA 101 within one window of FB_Q and then no DATA edges during the subsequent period of time during which FB_Q is low. This error condition is illustrated by window 420 during which one DATA edge 409 occurs, and then no DATA edges are present during immediately subsequent time period 421 when FB_Q is low. DATA edge 409 during window 420 is a falling edge in this example but could be a rising edge in other examples.

Figure 5:
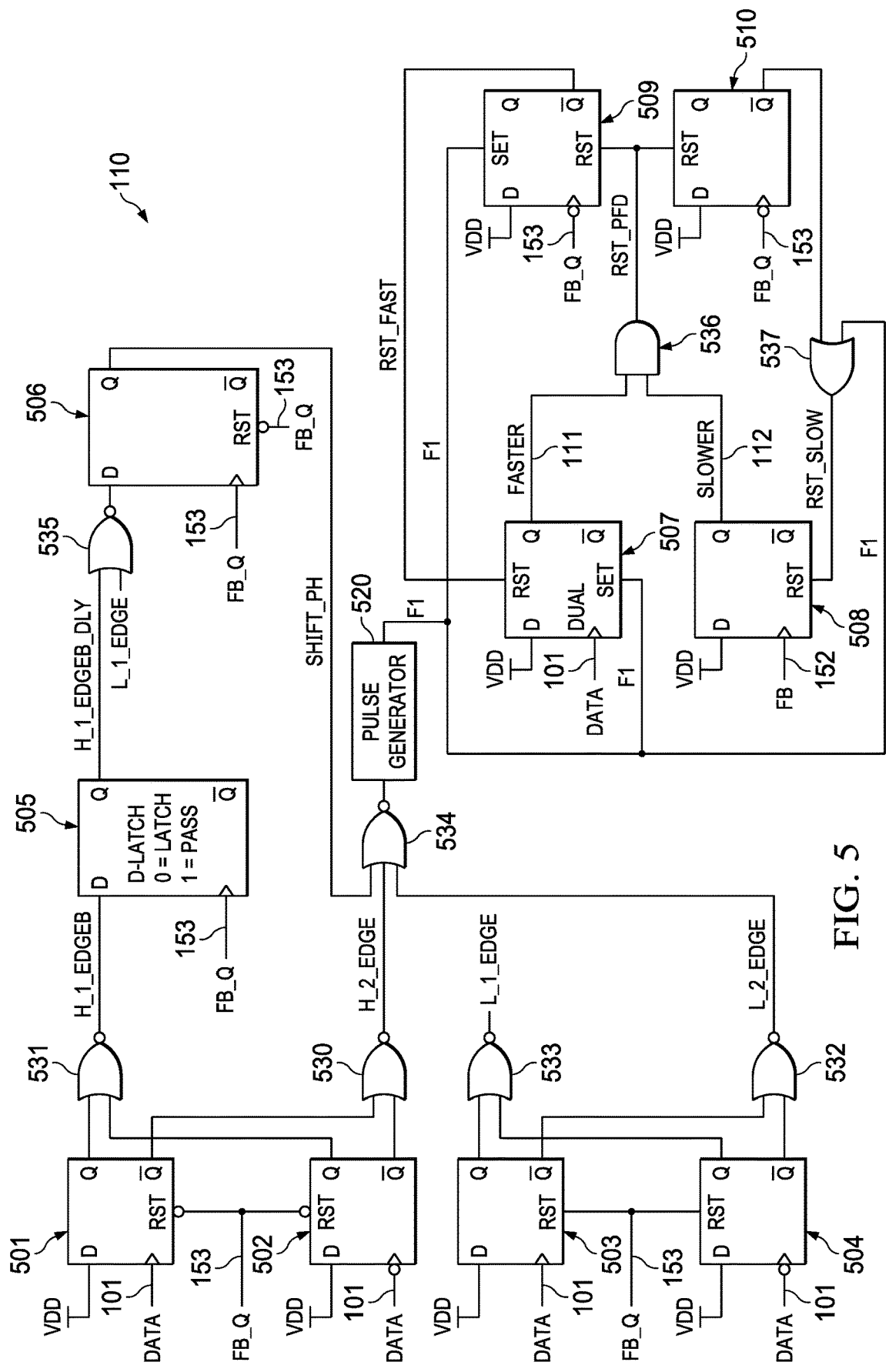
FIG. 5 is a schematic illustrating an example of a phase-frequency detector within the CDR circuit of FIG. 1.

FIG. 5 shows an example implementation of PFD 110. In this example, PFD 110 includes D flip-flops 501-504 and 507-510, latches 505 and 506, pulse generator 520, and logic gates 530-537. Logic gates 530-532, 534, and 535 comprise NOR gates, logic gates 533 and 537 comprises OR gates, and logic gate 536 comprises an AND gate.

Each logic gate 530-537 can be implemented as one or more other logic gates from those shown in the example of FIG. 5.

D flip-flops 501-504, 508, and 510 and latch 506 have reset inputs which, when actively asserted, cause the Q output of such flip-flops to become logic low (0) and the Qbar output to become logic high (1). Flip-flops 507 and 509 comprise both reset and set inputs. When asserted, the reset input causes the Q outputs to become logic low. When asserted, the set input causes the Q outputs to become logic high.

The D inputs of flip-flops 501-504 are tied to a logic high level (e.g., VDD). DATA 101 is coupled to the clock inputs of flip-flops 501-504, with the clock inputs of flip-flops 502 and 504 being inverted as shown. The Q outputs of flip-flops 501 and 502 are coupled to inputs of NOR gate 531, and the Qbar outputs of flip-flops 501 and 502 are coupled to inputs of NOR gate 530. The Q outputs of flip-flops 503 and 504 are coupled to inputs of OR gate 533, and the Qbar outputs of flip-flops 503 and 504 are coupled to inputs of NOR gate 532.

The output of NOR gate 531 provides a signal labeled H_1_EDGEB and is coupled to the D input of latch 505, and the outputs of NOR gates 530 and 532 are coupled to inputs of NOR gate 534. The output of NOR gate 530 provides a signal labeled H_2_EDGE. The output of NOR gate 532 provides a signal labeled L_2_EDGE. The output of OR gate 533 provides a signal labeled L_1_EDGE and is coupled to an input of NOR gate 535.

The reset inputs of flip-flops 501-504 and latch 506 and the clock inputs of latches 505 and 506 receive FB_Q 153 (the clock inputs of flip-flops 501 and 503 are inverted inputs as shown). The reset input of latch 506 also inverted. The Q output of latch 505 provides a signal labeled H_1_EDGEB_DLY and is coupled to an input of NOR gate 535. The output o NOR gate 535 is coupled to the D input of latch 506. The Q output of latch 506 provides a signal labeled SHIFT_PH and is coupled to an input of NOR gate 534. The output of NOR gate 534 is coupled to an input of pulse generator 520.

The pulse generator's output provides a signal labeled F1 and is coupled to the set inputs of flip-flops 507 and 509 and to an input of OR gate 537. The clock input of flip-flop 507 receives DATA 101, and the clock input of flip-flop 508 receives FB 152. The Q output of flip-flop 507 provides FASTER 111 and the Q output of flip-flop 508 provides SLOWER 112. The Q outputs of flip-flops 507 and 508 are coupled to inputs of AND gate 536, and the output of AND gate 536 provides a signal labeled RST PFD and is coupled to the reset inputs of flip-flops 509 and 510. The clock inputs (inverted) of flip-flops 509 and 510 receive FB_Q 153. The Qbar output of flip-flop 507 provides a signal labeled RST FAST and is coupled to the reset input of flip-flop 507. The Qbar output of flip-flop 510 is coupled to an input of OR gate 537, and the output of OR gate 537 provides a signal labeled RST SLOW and is coupled to the reset input of flip-flop 507.

Figure 6:
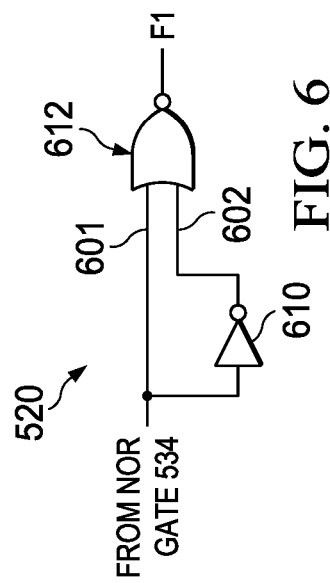
FIG. 6 shows an example implementation of a pulse generator of the phase-frequency detector of FIG. 5.

The pulse generator 520 generates a positive output pulse for F1 responsive to a falling edge of its input signal (i.e., the output signal from NOR gate 534). FIG. 6 shows an example of an implementation of pulse generator 520 comprising an inverter 610 and a NOR gate 612. The inputs to NOR gate 612 include the output signal from NOR gate 534 and an inverted signal from NOR gate 534. When the signal from NOR gate 534 is high, the input signal 601 to NOR gate 612 is 1 and the input signal 602 from inverter 610 is 0, and thus F1 from NOR gate 612 is 0. Upon the occurrence of a falling edge of the signal from NOR gate 534, signal 601 becomes a 0, and during the propagation delay of inverter 610, signal 602 remains at 0. Thus, during the propagation delay of inverter 612 both input signals 601 and 602 to NOR gate 612 are 0, and thus F1 is a 1. Following the propagation delay of inverter 610, signal 602 becomes a 1, and following the propagation delay of NOR gate 612, F1 becomes 0. Thus, F1 produces a positive pulse whose width is approximately equal to the propagation delay of inverter 610 and NOR gate 612.

Figure 7:
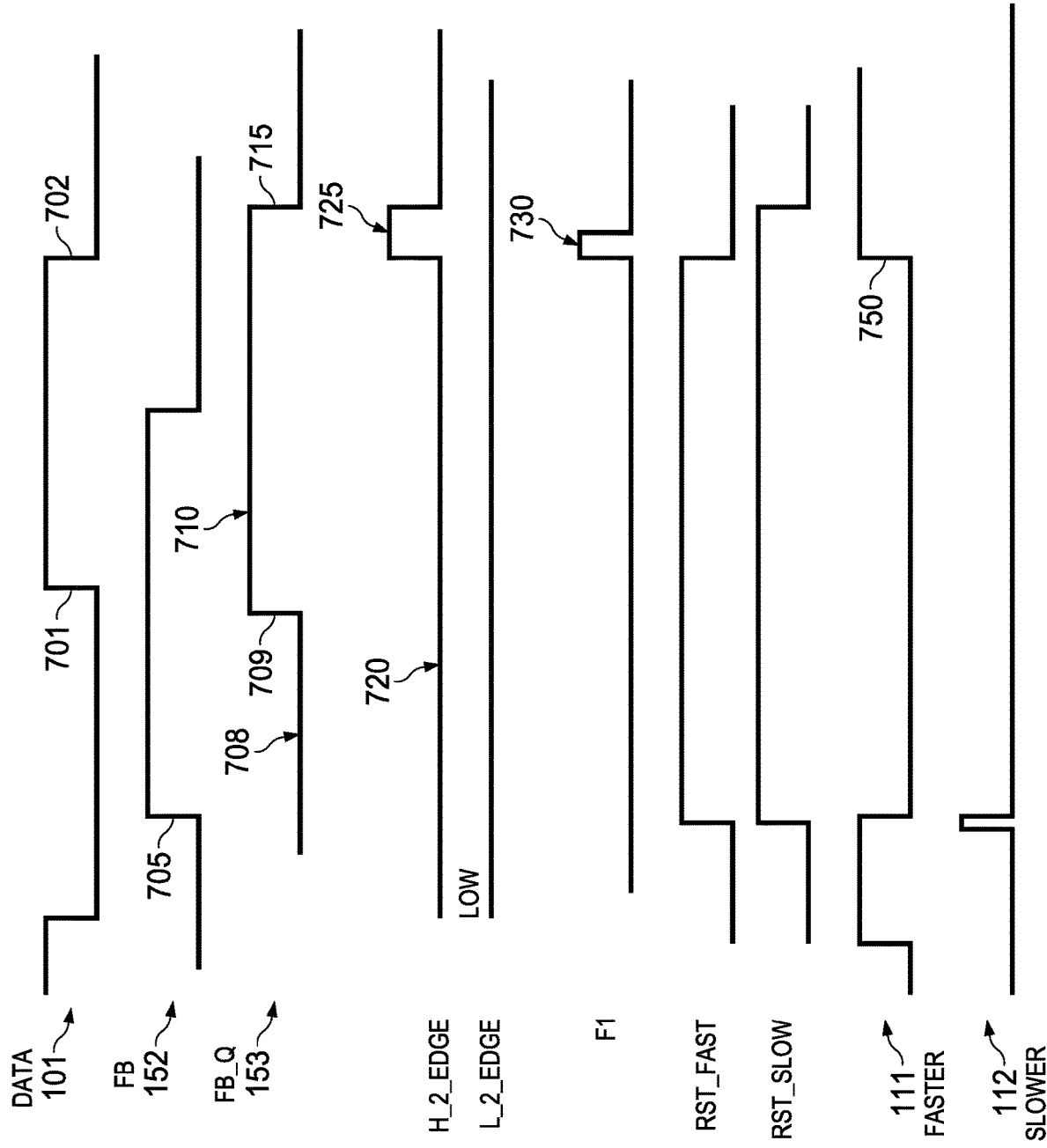
FIG. 7 is a timing diagram illustrating the operation of the phase-frequency detector of FIG. 5 to address the problem illustrated in FIG. 3.

FIG. 7 shows an example of the frequency of FB is slower than the frequency of DATA 101, and the detection of that condition by the detection of two DATA 101 edges 701 and 702 while FB_Q is high. Referring to FIG. 5 and the timing diagram of FIG. 7, during operation, flip-flops 501 and 502 and NOR gate 530 function to detect the occurrence of two edges of DATA 101 while FB_Q is high. When FB_Q is low as shown at 708, both flip-flops 501 and 502 are reset which causes their Q outputs to be 0 and their Qbar outputs to be 1. NOR gate 530 thus has both of its inputs at logic 1, which causes its output (H_2_EDGE) to be 0 (as shown at 720). The flip-flops 501 and 502 are released from their reset state when FB_Q becomes logic high at 709. Upon the occurrence of rising edge 701 of DATA 101, flip-flop 501 is clocked and its Q output becomes 1 and its Qbar output becomes 0. At that point, the input to NOR gate 530 from the Qbar output of flip-flop 501 is 0, and the other input of NOR gate 530 from the Qbar output of flip-flop 502 is still at logic 1, and thus H_2_EDGE remains at 0. However, upon the occurrence of the second edge 702 of DATA 101, flip-flop 502 is clocked and its Q output becomes 1 and its Qbar output becomes 0. At that point, both inputs of NOR gate 530 are 0 and thus the output of NOR gate 530 (H_2_EDGE) becomes high as shown at 725. Once FB_Q experiences the subsequent falling edge 715, both flip-flops 501 and 502 are reset thereby forcing their Q outputs to 0 and their Qbar outputs to 1, and H_2_EDGE becomes low again. Thus, H_2_EDGE pulses high at 725 when the second edge 702 of the two DATA edges 701 and 702 occurs while FB_Q is high.

The operation of flip-flops 503 and 504 and NOR gate 532 is similar that described above for flip-flops 501 and 502 and NOR gate 530, but for the detection of two DATA edges while FB_Q is low. The reset inputs of flip-flops 503 and 504 are not inverted, and thus flip-flops 50 and 504 are reset responsive to FB_Q being high. When FB_Q goes low, the flip-flops 503 and 504 are released from their reset states and the flip-flops 503 and 504 are clocked similar to that described above upon the occurrence of a pair of rising and falling edges while flip-flops 503/504 are not being reset. The output signal from NOR gate 532, L_2_EDGE pulses high upon the occurrence of the second edge of two DATA edges while FB_Q is low. In the example of FIG. 7, L_2_EDGE remains low because the timing diagram of FIG. 7 does not show two DATA edges while FB_Q is low.

The inputs of NOR gate 534 are normally all 0, and thus the output of NOR gate 534 to the pulse generator 520 is normally high. Upon the occurrence of two DATA edges while FB_Q is high or two DATA edges while FB_Q is low, at least one of the inputs of NOR gate 534 will experience a positive pulse, thereby causing the output of NOR gate 534 to pulse low. The pulse generator 520 responds to a falling edge on its input by generating a positive output pulse for F1 as described above, and as shown in FIG. 7 at 730. The F1 positive pulse is provided to the set inputs of flip-flops 507 and 509 and to one input of OR gate 537. When F1 is pulsed high (730), flip-flops 507 and 509 are set and flip-flop 508 (via OR gate 537) is reset. Setting flip-flop 507 forces FASTER 111 high as illustrated at 750. Resetting flip-flop 508 forces (or maintains) SLOWER 112 low. As such, any time F1 pulses high, the frequency of FB 152 is increased. As explained above, the occurrence of two DATA edges when FB_Q is high or the occurrence of two DATA edges when FB_Q is low indicates that the frequency of FB_Q (and the loop in general) is too low and the circuit of FIG. 5 responds by asserting FASTER 111 high to increase the frequency of the VCO output and thus the frequency of FB 152 and FB_Q 153.

FIG. 8 illustrates a timing diagram in which FB 152 is generally frequency-locked to DATA, but not properly phase locked. During window 810 of FB_Q 153, one single edge 802 of DATA 101 occurs, and during the immediately subsequent period of time in which FB_Q is then low (811), no edges of DATA 101 are present. This condition indicates that the loop has phase-locked but to the incorrect phase of DATA 101. The circuit of FIG. 5 causes F1 to pulse high at 820, which as explained above, causes FASTER 111 to be asserted high thereby causing the loop to increase the frequency of FB 152 and FB_Q 152 in attempt to correctly phase lock FB 152.

The above functionality is implemented, in part, by NOR gates 531, 533, and 535 and latches 505 and 506. NOR gate 531 provides the H_1_EDGEB signal, which indicates whether an edge of DATA 101 occurs while FB_Q 153 is high. While FB_Q is low, both flip-flops 501 and 502 are held in reset thereby forcing their Q outputs to be logic low. Accordingly, both inputs to NOR gate 531 are 0, and thus H_1_EDGEB is logic high. When FB_Q becomes logic high (e.g., at rising edge 807), flip-flops 501 and 502 are no longer reset and their Q outputs remain at 0 until clocked. Upon occurrence of a rising edge of DATA 101 flip-flop 501 is clocked and its Q output becomes 1, and thus H_1_EDGEB becomes a 0. Similarly, with H_1_EDGB high, upon occurrence of a falling edge of DATA 101 flip-flop 502 is clocked and its Q output becomes 1, and thus H_1_EDGEB becomes a 0. When FB_Q again goes low, flip-flops 501 and 502 are again reset and H_1_EDGEB again goes high. Thus, at least one edge of DATA 101 occurring when FB_Q is high causes H_1_EDGEB to be asserted low as illustrated at 816 and 817.

The active (low) assertion of H_1_EDGB is latched by latch 505 when FB_Q becomes high at 818 thereby resulting in output signal H_1_EDGEB_DLY (a delayed version of H_1_EDGEB due to the propagation delay of latch 505) from the latch 505. H_1_EDGEB_DLY is shown as latched low at 819. Latch 505 stores the state that at least one edge of DATA 101 occurred during a window of FB_Q.

During the subsequent time period 811 when FB_Q is low there are no edges of FB_Q and thus latch 506 is not clocked during that time period. The D input of latch 506 is driven by the output of NOR gate 535. The output of NOR gate 535 is the logical NOR of H_1_EDGE_DLY and L_1_EDGE. L_1_EDGE is provided by the output of OR gate 533, which ORs together the Q outputs of flip-flops 503 and 504. While FB_Q is low (which is the case during time period 811), flip-flops 503 and 504 are not reset. As such, the Q output of flip-flop 503 will become a 1 if a rising edge of DATA 101 occurs during time period 811. Similarly, the Q output of flip-flop 504 will become a 1 if a falling edge of DATA 101 occurs during time period 811. Until one DATA edge or the other occurs during time period 811, L_1_EDGE remains a 0, which case is illustrated at 827.

If H_1_EDGEB_DLY is a 0 (as will be the case if a DATA edge occurs during an FB_Q window (e.g., window 810) and L_1_EDGE also is a 0 (as will be the case if no edges of DATA 101 are present during the subsequent time period 811 when FB_Q is low), then the output of NOR gate 535 will be a 1. Upon the occurrence of the next rising edge of FB_Q (edge 821), latch 506 will be clocked thereby providing a logic high for SHIFT_PH (illustrated at 829) to an input of NOR gate 534. As explained above, a logic high on an input of NOR gate 534 will result in a positive pulse of F1 (820), which also causes FASTER 111 to be asserted high.

The circuit comprising flip-flops 507-510, AND gate 536, and OR gate 537 also function to control FASTER 111 and SLOWER 112 when neither of the problem conditions described above are present, that is, when neither (a) two DATA edges occurring while FB_Q is high (or low), nor (b) a least one DATA edge occurs during a window of FB_Q followed by no DATA edges during the immediate period of time when FB_Q is low, FASTER 111 and SLOWER 112 are controlled to maintain the CDR circuit 100 properly locked to enable accurate data recovery. Flip-flops 507 and 508 are neither set nor reset. As such, flip-flop 507 is clocked upon the occurrence of an edge of DATA 101 to the clock input flip-flop 507 and flip-flop 508 is clocked upon the occurrence of a rising edge of FB 152 to the clock input of flip-flop 508. If an edge of DATA 101 occurs before a rising edge of FB 152, flip-flop 507 is clocked thereby causing FASTER 111 to be asserted high to cause the frequency of FB 152 and FB_Q 153 to increase. If a rising edge of FB 152 occurs before an edge of DATA 101, flip-flop 508 is clocked thereby causing SLOWER to be asserted high to cause the frequency of FB 152 and FB_Q 153 to decrease. Upon the next falling edge of FB_Q 153, flip-flops 509 and 510 are clocked and RST FAST is driven low.

FASTER 111 and SLOWER 112 are controlled by clocking flip-flops 507 and 508, but such decisions to increase or decrease the frequency of FB 152 is overridden upon the occurrence of a positive pulse on F1. F1 pulses positively when either (a) two DATA edges occur while FB_Q is high (or low), or (b) a least one DATA edge occurs during a window of FB_Q followed by no DATA edges during the immediate period of time when FB_Q is low. When either of those conditions occur, F1 pulses high to cause the FB frequency to increase.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

What is claimed is:

1. A circuit, comprising:
   a voltage-controlled oscillator (VCO) including a VCO output;
   a frequency divider including a frequency divider input, a first frequency divider output, and a second frequency divider output, the frequency divider input coupled to the VCO output; and
   a phase-frequency detector (PFD) including a data input, a first PFD input, a second PFD input, and a control output, the control output coupled to the VCO, the first PFD input coupled to the first frequency divider output, and the second PFD input coupled to the second frequency divider output, the first frequency divider output is configured to provide a first frequency divider signal and the second frequency divider output is configured to provide a second frequency divider signal 90 degrees out of phase with respect to the first frequency divider signal, and the PFD is configured to detect an occurrence of at least two edges of a data signal on the data input while the second frequency divider signal is continuously logic high across the at least two edges.

2. The circuit of claim 1, wherein the PFD is configured to assert an indicator signal in response to detection of an edge of the data signal on the data input while the second frequency divider signal is logic high followed by an absence of any edges of the data signal on the data input while the second frequency divider output is low immediately following the second frequency divider signal being logic high.

3. A circuit, comprising:
   a voltage-controlled oscillator (VCO) including a VCO output;
   a frequency divider including a frequency divider input, a first frequency divider output, and a second frequency divider output, the frequency divider input coupled to the VCO output; and
   a phase-frequency detector (PFD) including a data input, a first PFD input, a second PFD input, and a control output, the control output coupled to the VCO, the first PFD input coupled to the first frequency divider output, and the second PFD input coupled to the second frequency divider output, the first frequency divider output is configured to provide a first frequency divider signal and the second frequency divider output is configured to provide a second frequency divider signal 90 degrees out of phase with respect to the first frequency divider signal, and the PFD is configured to detect occurrence of an edge of a data signal on the data input while the second frequency divider signal is logic high followed by an absence of any edges of the data signal on the data input while the second frequency divider signal is low immediately following the second frequency divider signal being logic high.

4. The circuit of claim 3, wherein the PFD is configured to detect an occurrence of at least two edges of the data signal on the data input while the second frequency divider signal is continuously logic high across the at least two edges.

\* \* \* \* \*